(12) United States Patent
Kim et al.

(10) Patent No.: US 10,983,027 B2
(45) Date of Patent: Apr. 20, 2021

(54) PATCH CORD POLARITY DETECTOR

(71) Applicant: PHOTONICS PLANAR INTEGRATION TECHNOLOGY INC, Gwangju (KR)

(72) Inventors: Jin Bong Kim, Gwangju (KR); Jin Goo Pyo, Gwangju (KR); Seung Hoon Chae, Gwangju (KR); Joo Hyeong Kim, Gwangju (KR); Ho Young Jeon, Gwangju (KR)

(73) Assignee: PHOTONICS PLANAR INTEGRATION TECHNOLOGY INC, Gwangju (KR)

( * ) Notice: Subject to any disclaimer, the term of this patent is extended or adjusted under 35 U.S.C. 154(b) by 0 days.

(21) Appl. No.: 16/651,263

(22) PCT Filed: Sep. 27, 2018

(86) PCT No.: PCT/KR2018/011363
§ 371 (c)(1),
(2) Date: Mar. 26, 2020

(87) PCT Pub. No.: WO2019/066454
PCT Pub. Date: Apr. 4, 2019

(65) Prior Publication Data
US 2020/0249122 A1 Aug. 6, 2020

(30) Foreign Application Priority Data
Sep. 29, 2017 (KR) .................. 10-2017-0127346

(51) Int. Cl.
*G01M 11/00* (2006.01)
*G02B 6/44* (2006.01)

(52) U.S. Cl.
CPC ......... *G01M 11/334* (2013.01); *G02B 6/4471* (2013.01)

(58) Field of Classification Search
CPC .. G02B 6/3809; G02B 6/4471; G02B 6/3898; G02B 6/2706; G02B 6/2773;
(Continued)

(56) References Cited

U.S. PATENT DOCUMENTS 7,808,621 B2    10/2010 Russell
9,435,713 B2 *  9/2016  Collier ............... G01M 11/3136
(Continued)

FOREIGN PATENT DOCUMENTS

JP    5-282589 A      10/1993
JP    2015-520379 A   7/2015

OTHER PUBLICATIONS

International Search Report in International Application No. PCT/KR2018/011363, filed Sep. 27, 2018.

*Primary Examiner* — Hoa Q Pham
(74) *Attorney, Agent, or Firm* — Saliwanchik, Lloyd & Eisenschenk

(57) ABSTRACT

The present disclosure relates to a polarity detector for detecting polarity of a patch cord, that is capable of sequentially inputting an optical signal into channels of a connector of the patch cord, receiving the optical signal being output, and thereby discerning the polarity of the patch cord quickly and precisely. Particularly, the present disclosure is characterized to spectrally output the optical signal from the light source as a plurality of unit optical signals, and to selectively block or pass the spectrally output plurality of unit optical signals, by heat, and thereby effectively inputting the optical signal into each channel of the connector.

6 Claims, 3 Drawing Sheets

(58) Field of Classification Search
CPC ........ G02B 6/3895; G02B 6/46; G02B 6/385;
G02B 2006/12138; G01M 11/335; G01M
11/333; G01M 11/3136; G01M 11/336;
G01M 11/088; H04B 10/071
USPC ............................................ 356/73.1; 385/11
See application file for complete search history.

(56) References Cited

U.S. PATENT DOCUMENTS

| | | | |
|---|---|---|---|
| 10,025,039 B1* | 7/2018 | Cummings | G01M 11/088 |
| 10,481,041 B2* | 11/2019 | Schell | G01M 11/333 |
| 2004/0015309 A1 | 1/2004 | Swisher et al. | |
| 2013/0194566 A1 | 8/2013 | Schell et al. | |
| 2019/0170610 A1* | 6/2019 | Perron | G01M 11/33 |
| 2020/0124498 A1* | 4/2020 | Leclerc | G01D 5/35374 |
| 2020/0264397 A1* | 8/2020 | Herman | G02B 6/385 |
| 2020/0379177 A1* | 12/2020 | Ota | G02B 6/2773 |

* cited by examiner

PATCH CORD POLARITY DETECTOR

CROSS-REFERENCE TO RELATED APPLICATIONS

This application is the U.S. national stage application of International Patent Application No. PCT/KR2018/011363, filed Sep. 27, 2018, which claims the benefit under 35 U.S.C. § 119 of Korean Application No. 10-2017-0127346, filed Sep. 29, 2017, the disclosures of each of which are incorporated herein by reference in their entirety.

1. FIELD

The present disclosure relates to a patch cord polarity detector, and more particularly, to a patch cord polarity detector that provides information for discerning the polarity of the patch cord.

2. BACKGROUND

An optical patch cord is used for branching, switching, and the like of optical lines in optical transmission equipment, optical distribution devices, and the like. It is manufactured by applying various forms of optical fibers such as 10/125 μm, 50/125 μm, and 62.5/125 μm, and various types of optical connectors.

The optical patch cord includes an optical cable consisting of a plurality of optical fibers, and a first connector and a second connector, respectively connected to either end of the optical cable. Here, in the first connector and the second connector, a plurality of channels are provided, respectively connected to the optical fibers.

In these first and second connectors, a key is formed on one of flat surfaces, and if this key is located on a lower portion of the connector, it is called a key down, and if the key is located on an upper portion of the connector, it is called a key up. In a key down or a key up direction, the channels of the connector are numbered in order according to the arrangement direction, and are displayed as P1, and P2, etc. Generally, a white dot is displayed on a side of the connector adjacent to the first channel, of the channels, and the polarity of the patch cord cable is determined according to the location of this white dot and the key.

Depending on the polarity defined by TIA 568 standard, three types of patch cords are used, wherein in the first type of patch cord, the optical fiber is connected to the channel having the same number in the first connector and the second connector. In the second type of patch cord, the optical fibers are connected to the channels of the second connector in reverse order of the order in which the optical fibers are connected to the channels of the first connector. For example, in the case of a patch cord having twelve optical fibers, if it is the second type, the optical fiber connected to P1 of the first connector is connected to P12 of the second connector, and the optical fiber connected to P2 of the first connector is connected to P11 of the second connector. In the third type of patch cord, the channel numbers that mutually adjacent optical fibers are connected in the first connector, and the channel numbers that they are connected in the second connector are interchanged. For example, in the case of a patch cord having twelve optical fibers, if it is the third type, the optical fiber connected to P1 of the first connector is connected to P2 of the second connector, the optical fiber connected to P2 of the first connector is connected to P1 of the second connector, the optical fiber connected to P3 of the first connector is connected to P4 of the second connector, and the optical fiber connected to P4 of the first connector is connected to P3 of the second connector.

An operator should select a patch cord that has the appropriate polarity according to the operation environment or operation device and perform the operation. However, there is a disadvantage that it is difficult for the operator to visually discern the polarity of the patch cord, and it is difficult to easily discern the polarity of the patch cord even with a prior art patch cord managing device, and thereby deteriorating the operation efficiency.

SUMMARY

Therefore, a purpose of the present disclosure is to resolve the aforementioned problems, that is, to provide a patch cord polarity detector that is capable of sequentially inputting an optical signal into channels of a connector of the patch cord, and then receiving the optical signal being output, to detect the polarity of the patch cord.

A patch cord polarity detector according to the present disclosure for achieving the purpose described above is a polarity detector for detecting polarity of a patch cord that includes a first connector having a plurality of first channels, a plurality of optical fibers installed at the first connector such that one ends of the optical fibers respectively communicate with the first channels, and a second connector installed at the other ends of the optical fibers, and having a plurality of second channels respectively communicating with the other ends of the optical fibers.

The patch cord polarity detector according to the present disclosure includes a signal input unit that is connected to the first connector of the patch cord, and that sequentially inputs an optical signal into the first channels of the first connector, a signal detector that is connected to the second connector of the patch cord, and that detects the second channel outputting the optical signal that passed through the optical fiber, of the second channels of the second connector, and an information provider that provides discernment information for discerning the polarity of the patch cord, based on detection information being provided through the signal detector.

The signal input unit includes a first connection terminal for connecting the first connector of the patch cord, a light source for generating the optical signal to be input into the first connection terminal, and a signal outputter provided between the light source and the first connection terminal to sequentially input the optical signal generated from the light source into the first channels of the first connector connected to the first connection terminal.

The signal outputter includes an inputter connected to the light source for inputting the input optical signal from the light source, an optical distributer connected to the inputter, and provided with a plurality of output waveguides such that the input optical signal input through the inputter can be spectrally output as a plurality of unit optical signals, but with output ends of the output waveguides respectively connected to the first channels of the first connector connected to the first connection terminal, a plurality of optical attenuators respectively installed at the output waveguides to block or pass the unit optical signal input into the output waveguide, by heat, and a controller that controls the optical attenuators.

The information provider may match and display information of the first channel into which the optical signal is input by the signal input unit, of the first channels, and information of the second channel where output of the optical signal input into the first channel, is detected through the signal detector, of the second channels.

The plurality of optical attenuators may include a resistor, and may block or pass the unit optical signal by heat generated by the resistor.

The controller may control the plurality of optical attenuators such that the unit optical signal passing through the output waveguides can be sequentially input into the first channels of the first connector connected to the first connection terminal, according to a predetermined input order.

The plurality of optical attenuators may adjust the amount of light of the unit optical signal passing through the output waveguide, by the heat of the resistor generated by current input into the resistor.

The signal detector may include a second connection terminal for connecting the second connector of the patch cord, an optical detector connected to the second connection terminal, and provided with a plurality of input waveguides respectively communicating with the second channels of the second connector connected to the second connection terminal such that the optical signal output from the second channels can be input, a detection sensor installed at the input waveguides of the optical detector, and detects the optical signal input into the input waveguide, and a channel discerner that discerns the second channel that output the optical signal, of the second channels of the second connector, based on information detected through the detection sensor.

The patch cord polarity detector according to the present disclosure is capable of sequentially inputting an optical signal into the channels of the connector of the patch cord, and of receiving the optical signal being output, to detect the polarity of the patch cord, and therefore has an advantage of discerning the polarity of the patch cord relatively quickly and precisely.

DETAILED DESCRIPTION

Figure 1:
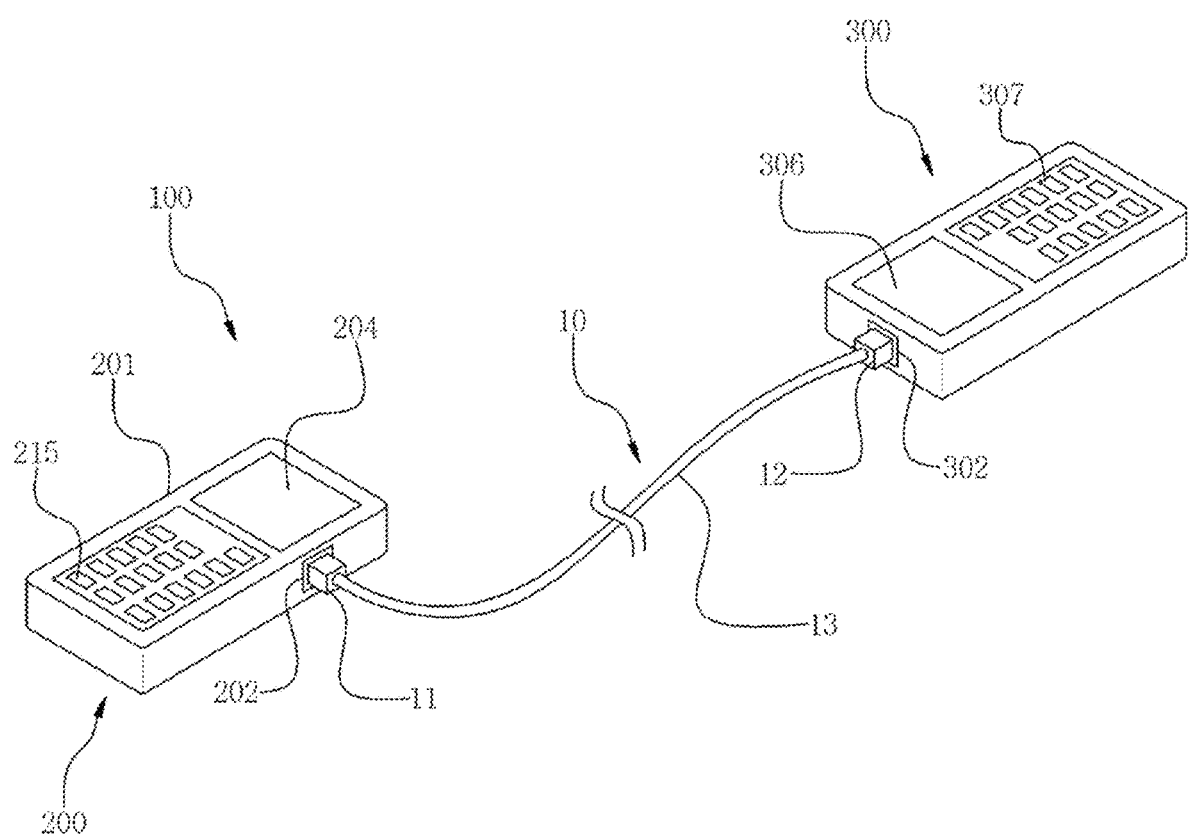
FIG. 1 is a perspective view of a patch cord polarity detector according to the present disclosure.

Hereinafter, a patch cord polarity detector according to an embodiment of the present disclosure will be described in detail with reference to the drawings attached. Various modifications may be made to the present disclosure and the present disclosure may have various embodiments, and thus specific embodiments shall be exemplified in the drawings and described in detail. However, this is not intended to limit the present disclosure to specific embodiments, and it should be understood that all changes, equivalents, and substitutes included in the spirit and technical scope of the present disclosure are included. In describing the drawings, like reference numerals are used for like components. In the drawings attached, the dimensions of the structures are shown to be enlarged from the actual size for clarity of the present disclosure.

Even though "a first" or "a second" and the like are used to describe various components, but these components are not limited by the aforementioned terms. The aforementioned terms may only be used to differentiate one component from other components. Therefore, a first component mentioned hereinafter may be a second component within the technical idea of the present disclosure.

The terms used herein are for the purpose of only describing specific embodiments and are not intended to limit the present disclosure. Singular expressions include plural expressions unless the context clearly indicates otherwise. In the present application, it is to be understood that terms such as "include" or "have" are intended to indicate that there is a feature, number, step, operation, component, part, or combination thereof described in the specification, and not to exclude the presence or the possibility of addition of one or more other features, numbers, steps, operations, components, parts, or combinations thereof.

Unless defined otherwise, all the terms used in the present specification including technical or scientific terms have the same meanings as they would be commonly understood by a person skilled in the related art. Terms such as those defined in commonly used dictionaries should be interpreted as having meanings consistent with the meanings in the context of related technologies. Further, the terms defined in generally used dictionaries should not be construed ideally or overly unless clearly defined specially.

Figure 2:
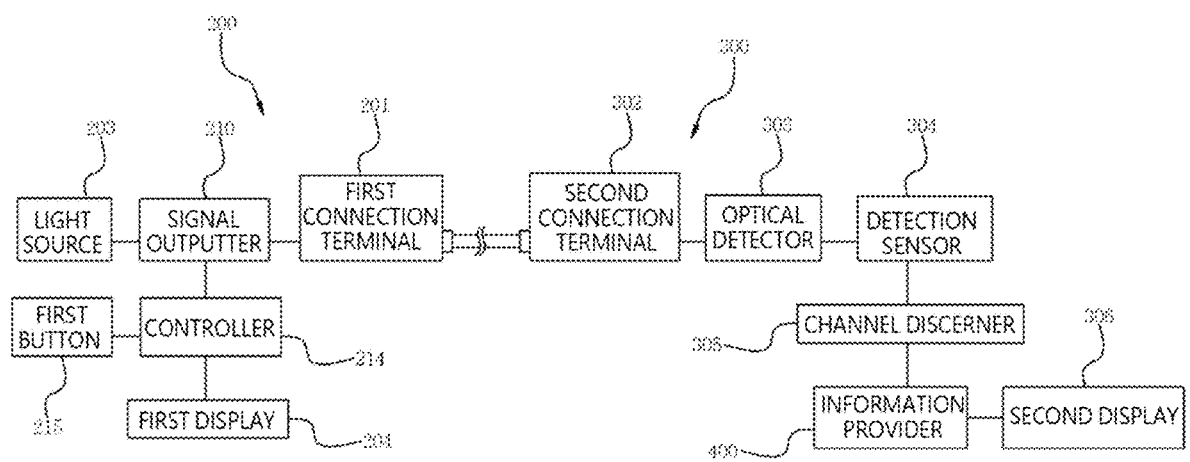
FIG. 2 is a block diagram of the patch cord polarity detector of FIG. 1.
Figure 3:
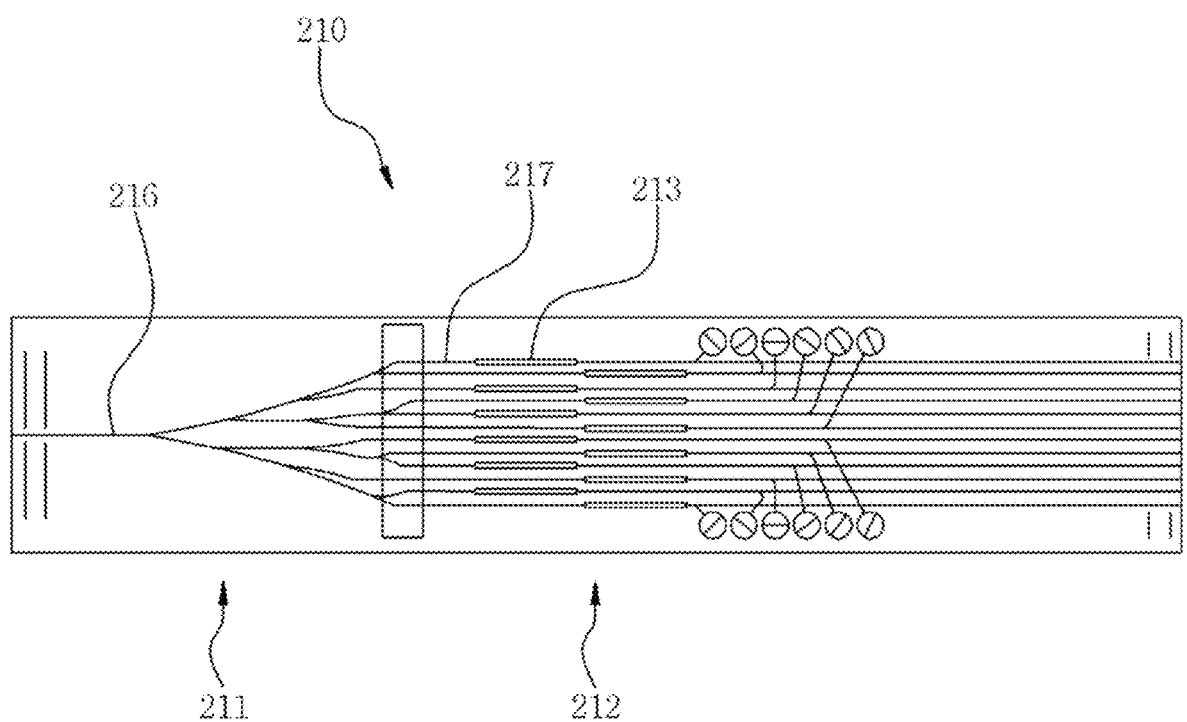
FIG. 3 is a schematic view of the signal outputter of the patch cord polarity detector of FIG. 1.

FIGS. 1 to 3 illustrate a patch cord polarity detector 100 according to an embodiment of the present disclosure.

Referring to the drawings, the patch cord polarity detector 100 is a device for inputting an optical signal into a patch cord 10, and detecting the optical signal being output from the patch cord 10, to discern the polarity of the patch cord 10.

Here, the patch cord 10 includes a first connector 11 having a plurality of first channels, a plurality of optical fibers 13 installed at the first connector 11 such that one ends of the optical fibers respectively communicate with the first channels, and a second connector 12 installed at the other ends of the optical fibers 13, and having a plurality of second channels respectively communicating with the other ends of the optical fibers 13. Here, in the first and second connectors 11, 12, the channels are numbered, and although not illustrated in the drawings, a white dot is displayed at one side, and the channels are numbered such that the farther away the channel is from the white dot, the greater its number.

The patch cord polarity detector 100 includes a signal input unit 200 that is connected to the first connector 11 of the patch cord 10, and that sequentially inputs an optical signal into the first channels of the first connector 11, a signal detector 300 that is connected to the second connector 12 of the patch cord, and that detects the second channel outputting the optical signal that passed through the optical fiber 13, of the second channels of the second connector 12, and an information provider 400 that provides discernment information for discerning the polarity of the patch cord 10, based on detection information being provided through the signal detector 300.

The signal input unit includes a first main body 201, a first connection terminal 202 provided in the first main body 201 and for connecting the first connector 11 of the patch cord 10, a light source 203 for generating an optical signal to be input into the first connection terminal 202, a signal outputter 210 provided between the light source 203 and the first connection terminal 202, to sequentially input the optical signal generated from the light source 203, into the first channels of the first connector 11 connected to the first connection terminal 202, and a first display 204 installed on an upper surface of the first main body 201 to display the operation state of the signal outputter 210.

The first main body 201 has inside it an internal space such that the light source 203 and the signal outputter 210 can be installed, and on an upper surface of the first main body 201, the first display 204 and a first button 215 of the signal outputter 210, that will be described hereinafter, are installed. Further, although not illustrated in the drawings, the first main body 201 also has inside it a battery that can supply electricity to the light source 203, the first display 204 and the signal outputter 210.

The first connection terminal 202 is installed on one side of the first main body 201, and a first insertion hole (not illustrated) is formed such that an end of the first connector 11 of the patch cord 10, can be inserted. Meanwhile, although not illustrated in the drawings, on an inner surface of a location opposite the first channels of the first connector 11 inserted into the first insertion hole, the first connection terminal 202 has a plurality of connection terminals respectively communicating with the first channels of the first connector 11. Through the connection terminals of the first connection terminal 202, an optical signal is input into each first channel of the first connector 11.

The light source 203 is installed inside the first main body 201, and a light generating means for generating an input optical signal of a predetermined wavelength, is applied. The light source 203 is a light source 203 device generally used in prior art, and thus detailed description is omitted.

The signal outputter 210 includes an inputter 211 connected to the light source 203, for inputting the optical signal input from the light source 203, an optical distributer 212 connected to the inputter 211 and provided with a plurality of output waveguides 217 such that the input optical signal input through the inputter 11 can be spectrally output as a plurality of unit optical signals, a plurality of optical attenuators 213 respectively installed at the output waveguides 217 to block or pass the unit optical signal input into the output waveguide 21, and a controller 214 that controls the optical attenuators 213 such that the unit optical signal passing through the output waveguides 217 can be sequentially input into the first channels of the first connector 11 connected to the first connection terminal 202, according to a predetermined input order.

One side of the inputter 211 is connected to the light source 203, and the inputter 211 has a main waveguide 216 such that the input optical signal input from the light source 203 can pass through. The optical distributer 212 is formed integrally with the inputter 211, at the other side of the inputter 211. Further, in the optical distributer 212, a plurality of output waveguides 217 are formed, diverged from the main waveguide 216 of the inputter 211. Here, although not illustrated in the drawings, the output waveguides 217 are respectively connected to the connection terminals of the first connection terminal 202 such that output ends of the output waveguides respectively communicate with the first channels of the first connector 11 connected to the first connection terminal 202. Here, it is desirable that the output end of the output waveguides 217 of the optical distributer 212 and the connection terminals of the first connection terminal 202 are connected by a connecting optical fiber.

The input optical signal input from the light source 203 into the main waveguide 216 of the inputter 211 is spectrally output as a plurality of unit optical signals by the output waveguides 217 of the optical distributer 212, and are then respectively input into the connection terminals of the first connection terminal 202. The unit optical signals input into the first connection terminal 202 are respectively input into the first channels of the first connector 11.

Meanwhile, in the illustrated example, a structure is illustrated where twelve output waveguides 217 are provided in the optical distributer 212. However, the optical distributer 212 is not limited to have twelve output waveguides 217, and thus depending on the number of the optical fibers 13 of the patch cord 10, or the number of channels of the first and second connectors 11, 12, the optical distributer 212 may have not more than eleven output waveguides 217, or thirteen or more output waveguides 217.

The plurality of optical attenuators 213 are respectively installed at the output waveguides 217 of the optical distributer 212 to block or pass the unit optical signal input into the output waveguide 217. It is desirable that the optical attenuator 213 is a variable attenuator such as VOA that adjusts the amount of light of the unit optical signal passing through the output waveguide 217 by an input current. The optical attenuator 213 has a resistor at one side thereof, and when a current is applied to the resistor, heat is generated from the resistor, and the amount of light of the unit optical signal passing through, is reduced by this generated heat. Here, when a certain current or more is applied, the optical attenuator 213 blocks the unit optical signal from passing through the output waveguide 217.

Meanwhile, the optical attenuator 213 is not limited to the example described above, and thus the optical attenuator 213 may be any optical control means that can selectively block the unit optical signal passing through the output waveguide 217.

The controller 214 is connected to the optical attenuators 213 to control the operation of the optical attenuators 213. The controller 214 sequentially applies current to the optical attenuators 213 to control the optical attenuators 213. Here, the optical attenuators 213 are controlled such that the unit optical signal is input into the first channels of the first connector 11 in order. That is, the controller 214 controls the optical attenuators 213 such that the unit optical signal is sequentially input from the first first channel to the twelfth first channel based on the predetermined numbering in the first connector 11.

Meanwhile, the signal outputter 210 further includes a first button 215 for an operator to input an operating signal of the light source 203 and information of setting values of the controller 214. The first button 215 is installed on the upper surface of the first main body 201, and the first button 215 has a plurality of buttons for inputting the operating signal of the light source 203 and the setting values of the controller 214. When the operator inputs the operating signal of the light source 203 through the first button 215, the controller 214 operates the light source 203, and controls operation of the optical attenuators 213. Further, through the first button 215, the operator may reset the order of a first panel where the unit optical signal is input.

The first display 204 is for displaying the operating state of the light source 203 or the control state and the like of the controller 214 regarding the optical attenuators 213, and the first display 204 has a display panel installed on the upper surface of the first main body 201. For the first display 204, an LED panel or an LCD panel may be applied.

The signal detector 300 includes a second main body 301, a second connection terminal 302 installed in the second main body 301 and for connecting the second connector 12 of the patch cord 10, an optical detector 303 connected to the second connection terminal 302, and provided with a plurality of input waveguides respectively communicating with the second channels of the second connector 12 connected to the second connection terminal 302 such that the optical signal output from the second channels can be input, a detection sensor 304 installed at the input waveguides of the optical detector 303, and detects the optical signal input into the input waveguide, and a channel discerner 305 that discerns the second channel that output the optical signal, of the second channels of the second connector 12, based on information detected through the detection sensor 304.

The second main body 301 has inside it an internal space such that the optical detector 303 and the detection sensor 304 can be installed, and on an upper surface of the second main body 301, a second display 306 and a second button 307 that will be described hereinafter are installed. Further, although not illustrated in the drawings, the second main body 301 also has inside it a battery that can supply electricity to detection sensor 304 and the channel discerner 305.

The second connection terminal 302 is installed on a side surface of the second main body 301, and a second insertion hole (not illustrated) is formed such that an end of the second connector 12 of the patch cord 10 can be inserted. Meanwhile, although not illustrated in the drawings, on an inner surface of a location opposite the second channels of the second connector 12 inserted into the second insertion hole, the second connection terminal 302 has a plurality of connection terminals respectively communicating with the second channels of the second connector 12. Through the connection terminals of the second connection terminal 302, the optical signal output from each of the second channels of the second connector 12, is input.

The optical detector 303 is connected to the second connection terminal 302, and although not illustrated in the drawings, the optical detector 303 has inside it a plurality of input waveguides. The input waveguides are where the unit optical signal passes through, and one ends of the input waveguides are respectively connected to the connection terminals of the second connection terminal 302. The unit optical signal that passed through the optical fiber 13 of the patch cord 10 is input into the second connection terminal 302 through the second connector 12, and the unit optical signal input into the second connection terminal 302 is input into the input waveguide of the optical detector 303 through the connection terminal of the second connection terminal 302.

A plurality of detection sensors 304 are respectively installed at the input waveguides to detect the unit optical signal passing through the input waveguide. The detection sensor 304 is an optical sensing means that is generally used in prior art, for detecting an optical signal and creating a detection signal, and thus detailed description is omitted.

The channel discerner 305 receives detection information from the detection sensor 304, analyzes the detection information, and discerns the second channel that output the unit optical signal. Here, although not illustrated in the drawings, the channel discerner 305 includes a database that stores the numbering information regarding the second channel of the second connector connected to each input waveguide. The channel discerner 305 compares the detection information input into the detection sensor 304 and the numbering information regarding the second channel stored in the database, and discerns the second channel into which the unit optical signal is input, of the second channels.

Meanwhile, the signal detector 300 further includes the second display 306 installed on the upper surface of the second main body 301 to display information, and the second button 307 for the operator to input an operating signal.

The second display 306 is for displaying the detection information of the detection sensor 304 or the discernment information and the like provided from the information provider 400, and includes a display panel installed on the upper surface of the second main body 301. An LED panel or an LCD panel may be applied for the second display 306. The second button 307 is installed on the upper surface of the second main body 301, and includes a plurality of buttons for the operator to input operating signals of the detection sensor 304 or the second display 306.

The information provider 400 receives information from the channel discerner 305 and the controller 214 of the signal outputter 210, and matches the numbering information of the first channel into which the unit optical signal is input, and the numbering information of the second channel that output the unit optical signal, and creates the discernment information. The information provider 400 is connected to the controller 214 of the signal outputter 210 and the channel discerner 305 wiredly or wirelessly. Here, the information provider 400 mutually matches the numbering information of the first channel into which the unit optical signal is input, provided from the signal outputter 210, and the numbering information of the second channel that output the unit optical signal, provided from the channel discerner 305, and displays the matching result through the second display 306. That is, the information provider 400 displays the information of the first channel into which the optical signal is input by the signal input unit 200, of the first channels, and the information of the second channel where output of the optical signal input into the first channel, is detected, through the signal detector 300, of the second channels.

The operator determines the polarity of the patch cord 10 subject to inspection based on the information displayed on the second display 306 by the information provider 400.

A patch cord polarity detecting method using the patch cord polarity detector 100 according to the present disclosure configured as described above, is described hereinafter.

First, the first connector 11 and the second connector 12 of the patch cord 10, are connected to the first connection terminal 202 of the signal input unit 200, and the second connection terminal 302 of the signal detector 300. The first connector 11 is connected to the first connection terminal 202, and the controller 214 operates the optical attenuators 213 such that the unit optical signal is sequentially input from the first first channel to the twelfth first channel, based on the predetermined numbering in the first connector 11.

Here, the unit optical signal input into the first channel is input into the input waveguide of the optical detector 303 through the optical fiber 13 and the second channel of the second connector 12, and then detected by the detection sensor. The channel discerner 305 of the signal detector 300 receives the detection information from the detection sensor 304, and discerns the numbering information of the second channel that output the unit optical signal. The discerned numbering information of the second channel is transmitted to the information provider 400, and the information provider 400 mutually matches the numbering information of the first channel into which the unit optical signal is input, and the numbering information of the second channel that output the unit optical signal, based on the information provided from the controller 214, and displays the matched result through the second display 306. The operator discerns the polarity or type of the patch cord 10 subject to inspection through the information output on the second di splay 306.

The patch cord polarity detector 100 according to the present disclosure is capable of sequentially inputting the optical signal into the channels of the connector of the patch cord 10, and of receiving the optical signal being output, to detect the polarity of the patch cord 10, and therefore has an advantage of discerning the polarity of the patch cord 10 relatively quickly and precisely.

The description of the presented embodiments is provided to enable any person of ordinary skill in the art to use or practice the present disclosure. Various modifications to these embodiments will be apparent to those skilled in the art of the present disclosure, and the general principles defined herein may be applied to other embodiments without departing from the scope of the present disclosure. Thus, the present disclosure should not be limited to the embodiments presented herein, but should be interpreted in the broadest scope consistent with the principles and novel features presented herein.

What is claimed is:

1. A patch cord polarity detector for detecting polarity of a patch cord that comprises a first connector having a plurality of first channels, a plurality of optical fibers installed at the first connector such that one ends of the optical fibers respectively communicate with the first channels, and a second connector installed at the other ends of the optical fibers and having a plurality of second channels respectively communicating with the other ends of the optical fibers, wherein the patch cord polarity detector comprises:
a signal input unit that is connected to the first connector of the patch cord, and that sequentially inputs an optical signal into the first channels of the first connector;
a signal detector that is connected to the second connector of the patch cord, and that detects the second channel outputting the optical signal that passed through the optical fiber, of the second channels of the second connector; and
an information provider that provides discernment information for discerning the polarity of the patch cord, based on detection information being provided through the signal detector,
the signal input unit comprising a first connection terminal for connecting the first connector of the patch cord; a light source for generating the optical signal to be input into the first connection terminal; and a signal outputter provided between the light source and the first connection terminal, to sequentially input the optical signal generated from the light source, into the first channels of the first connector connected to the first connection terminal,
and the signal outputter comprising:
an inputter connected to the light source for inputting the input optical signal from the light source;
an optical distributer connected to the inputter, and provided with a plurality of output waveguides such that the input optical signal input through the inputter can be spectrally output as a plurality of unit optical signals, but with output ends of the output waveguides respectively connected to the first channels of the first connector connected to the first connection terminal;
a plurality of optical attenuators respectively installed at the output waveguides, to block or pass the unit optical signal input into the output waveguide, by heat; and
a controller that controls the optical attenuators.

2. The patch cord polarity detector according to claim 1, wherein the information provider matches and displays information of the first channel into which the optical signal is input by the signal input unit, of the first channels, and information of the second channel where output of the optical signal input into the first channel, is detected through the signal detector, of the second channels.

3. The patch cord polarity detector according to claim 1, wherein the controller controls the plurality of optical attenuators such that the unit optical signal passing through the output waveguides can be sequentially input into the first channels of the first connector connected to the first connection terminal, according to a predetermined input order.

4. The patch cord polarity detector according to claim 1, wherein the signal detector comprises:
a second connection terminal for connecting the second connector of the patch cord;
an optical detector connected to the second connection terminal, and provided with a plurality of input waveguides respectively communicating with the second channels of the second connector connected to the second connection terminal such that the optical signal output from the second channels can be input;
a detection sensor installed at the input waveguides of the optical detector, and detects the optical signal input into the input waveguide; and
a channel discerner that discerns the second channel that output the optical signal, of the second channels of the second connector, based on information detected through the detection sensor.

5. The patch cord polarity detector according to claim 1, wherein the plurality of optical attenuators comprise a resistor, and block or pass the unit optical signal by heat generated by the resistor.

6. The patch cord polarity detector according to claim 5, wherein the plurality of optical attenuators adjust the amount of light of the unit optical signal passing through the output waveguide, by the heat of the resistor generated by current input into the resistor.

* * * * *